United States Patent [19]

Cannella et al.

[11] Patent Number: 4,672,454
[45] Date of Patent: Jun. 9, 1987

[54] X-RAY IMAGE SCANNER AND METHOD

[75] Inventors: Vincent D. Cannella, Birmingham; Zvi Yaniv, Southfield; Robert R. Johnson, Franklin, all of Mich.

[73] Assignee: Energy Conversion Devices, Inc., Troy, Mich.

[21] Appl. No.: 678,105

[22] Filed: Dec. 4, 1984

Related U.S. Application Data

[63] Continuation-in-part of Ser. No. 607,153, May 4, 1984.

[51] Int. Cl.$^4$ .......................... H04N 3/14; H04N 5/32
[52] U.S. Cl. ............................... 358/213.11; 358/110; 358/111
[58] Field of Search ....................... 358/213, 110, 111; 357/24 LR

[56] References Cited

U.S. PATENT DOCUMENTS

| | | | |
|---|---|---|---|
| 3,696,520 | 10/1972 | Weimer | 358/213 |
| 4,067,046 | 1/1978 | Nakatani et al. | 358/213 |
| 4,160,997 | 7/1979 | Schwartz | 358/111 |
| 4,226,898 | 10/1980 | Ovshinsky et al. | 357/2 |
| 4,471,378 | 9/1984 | Ng | 358/110 |
| 4,482,804 | 11/1984 | Oritsuki et al. | 358/213 |

Primary Examiner—Gene Z. Rubinson
Assistant Examiner—Stephen Brinich
Attorney, Agent, or Firm—M. S. Siskind; R. M. Goldman

[57] ABSTRACT

An apparatus for providing electrical signals representative of an image formed by X-rays projected thereon includes a two-dimensional array of spaced apart light sensitive sensors formed from deposited semiconductor material. The elements are capable of effecting a detectable electrical characteristic responsive to the intensity of light received thereon. A phosphorescent layer overlying the light sensitive elements receives the projected X-ray image and produces light in response to the impingement of the X-rays thereon. Isolation elements enable the selective addressing of the light sensitive elements. A method of converting an image from electromagnetic energy to a plurality of electrical signals is also disclosed.

13 Claims, 9 Drawing Figures

X-RAY IMAGE SCANNER AND METHOD

RELATED APPLICATION

The present application is a continuation-in-part of the copending application Ser. No. 607,153, filed May 4, 1984 for Contact Type Document Scanner And Method.

FIELD OF THE INVENTION

The present invention relates to an apparatus and method for providing electrical signals representative of an image formed by projected X-rays or other forms of energy having high and low intensities.

BACKGROUND OF THE INVENTION

Systems are known for converting an image, such as characters of a document to electrical signals which can be stored in a memory for later recall or transmitted to a remote location over, for example, telephone communication or similar systems. Systems of this type have generally been referred to as line scanners. In one type of line scanner, the document is held stationary and a photodetector or detectors are scanned across each line of the document along with a localized light source. In another type of scanner, the photodetector and light source are held stationary and the document is moved. In both types of systems, as the document is scanned, the high optical density or dark portions of the document reflect less light from the light source into the detector than the low optical density or light portions. As a result, the high and low optical density portions can be contrasted by the photodetector for generating electrical signals representative of the character images of the document.

While systems of the type above have been generally successful in fulfilling their intended purposes and have found commercial acceptance, these systems have exhibited several deficiencies. For example, line scanner systems are rather complex. They require mechanical drive and servo systems to precisely control the movement of the photosensor and light source relative to the document being scanned to enable accurate data storage or transmission of the electrical signals for the ultimate faithful reproduction of the document. When a single detector and light source are used, these mechanical drives and servo systems must accurately control such relative movement both across the document and down the length of the document.

When a plurality of colinear detectors and light sources are employed to enable line-by-line scanning of a document, fiber optics are generally used to convey light to operative association with each detector. Hundreds of individual detectors and corresponding optical fibers are required for such operation. This not only adds to the complexity of the overall system, but in addition, introduces fiber optic coupling problems as well.

Prior art line scanners also require frequent or periodic servicing. This results due to their complexity and the incorporation of moving parts which are subject to wear.

In addition to the foregoing, prior art line scanners require a significant period of time to scan a document. This is due to the fact that the mechanical moving parts can only be driven at a speed which precludes damage to the moving parts and which ensures proper synchronization with a companion printer or data input storage. Scanners of the prior art are therefore extremely inconvenient to use when a document of many pages must be scanned.

Lastly, prior art scanners are physicaly bulky and heavy. This is due to the rather heavy mechanical parts incorporated therein and most particularly the motor or motors utilized for driving the moving parts. Hence, prior art scanners do not lend themselves to portability and generally can only be used at a fixed location.

SUMMARY OF THE INVENTION

The invention provides a new and improved apparatus and method for providing electrical signals representative of an image formed by a spatial distribution of a first form of energy projected onto the apparatus. The apparatus includes an array of spaced apart, energy sensitive elements and converting means arranged for receiving said energy distribution and for converting the first form of energy to a second form of energy. The elements are capable of effecting a detectable electrical characteristic responsive to the intensity of the second form of energy received from the converting means. The apparatus further includes means for enabling the selective detection of the electrical characteristic of each element.

The present invention more particularly provides an apparatus for providing electrical signals representative of an electromagnetic image projected thereon. The apparatus includes a first set of address lines and a second set of address lines spaced from and crossing at an angle to the first set of address lines to form a plurality of crossover points. The apparatus further includes a photosensor comprising light sensitive elements associated with at least some of the crossover points and adapted to effect a detectable change in electrical conductivity in response to receipt of incident light. The apparatus further includes converting means overlying the elements and arranged for receiving the projected electromagnetic image and for providing the incident light responsive to the impingement thereof. Isolation means associated with each light sensitive element facilitate the selective addressing and detection of the electrical conductivity of each light sensitive element by the application of read potentials to respective pairs of the first and second sets of address lines.

In accordance with a preferred embodiment of the invention, the image is represented by spatially distributed X-rays with intensities in a first energy range. Any other form of electromagnetic energy may also be used.

The light sensitive elements can comprise, for example, photovoltaic cells or photoresistors. The light sensitive elements can be formed from deposited semiconductor material, and preferably from an amorphous semiconductor alloy.

The converting means includes a layer of phosphorescent material. The phosphorescent material is positioned between a grounded metal layer and a transparent insulating layer. The insulating layer, preferably silicon dioxide, overlies the array of energy sensitive elements. The energy converter converts a first form of energy, (such as X-rays), with photon/particle energy in a first energy range into a second form of energy, (such as visible light), with photon or particle energies in a second range. The first form of energy can be not only radiant electromagnetic energy, such as X-rays, but could also be an accelerated particle beam, such as an accelerated beam of electrons.

The isolation devices can comprise diodes or field effect transistors, for example. The isolation devices can also be formed from deposited semiconductor material and preferably amorphous semiconductor alloys.

The present invention further provides a method of generating electrical signals representative of an image. The method includes providing a spatially varying intensity distribution of a first form of energy corresponding to the image, converting the intensity distribution into a spatially distributed second form of energy, sensing the intensity distribution of the second form of energy and forming a plurality of electrical signals in response thereto.

The method can also include the steps of providing an array of light sensitive elements capable of effecting a detectable change in electrical conductivity responsive to the receipt of light thereon in spaced apart relation, overlying the elements with a conversion material capable of converting X-ray energy to light, projecting the X-ray image onto the conversion material and selectively applying read potentials to the light sensitive elements for detecting the electrical conductivity of the elements and deriving an electrical signal for each element representative of the electrical conductivity of each element.

The method can include the further step of dividing the elements into groups of elements and applying the read potentials to each group of elements in parallel while the image is projected onto the conversion material. The read potentials can be serially applied to the elements within each group of elements.

The method and the apparatus of the present invention can also include as a first form of energy, a spatially deflected beam of accelerated particles used to form an energy intensity distribution corresponding to the image. The energy intensity distribution so formed can be converted into a second form of energy, such as visible light, using a layer of phosphorescent material.

DESCRIPTION OF THE PREFERRED EMBODIMENTS

Figure 1:
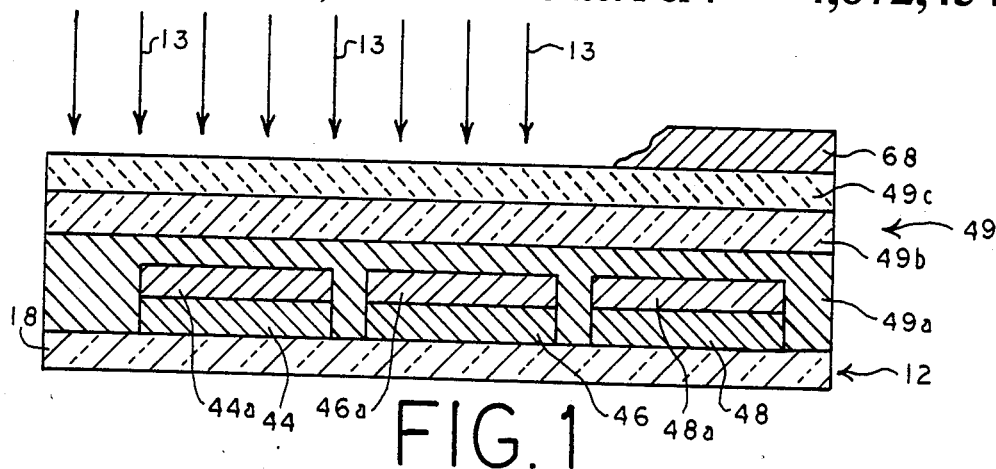
FIG. 1 is a partial side view, partly in cross section, of an X-ray image scanner apparatus embodying the present invention.
Figure 2:
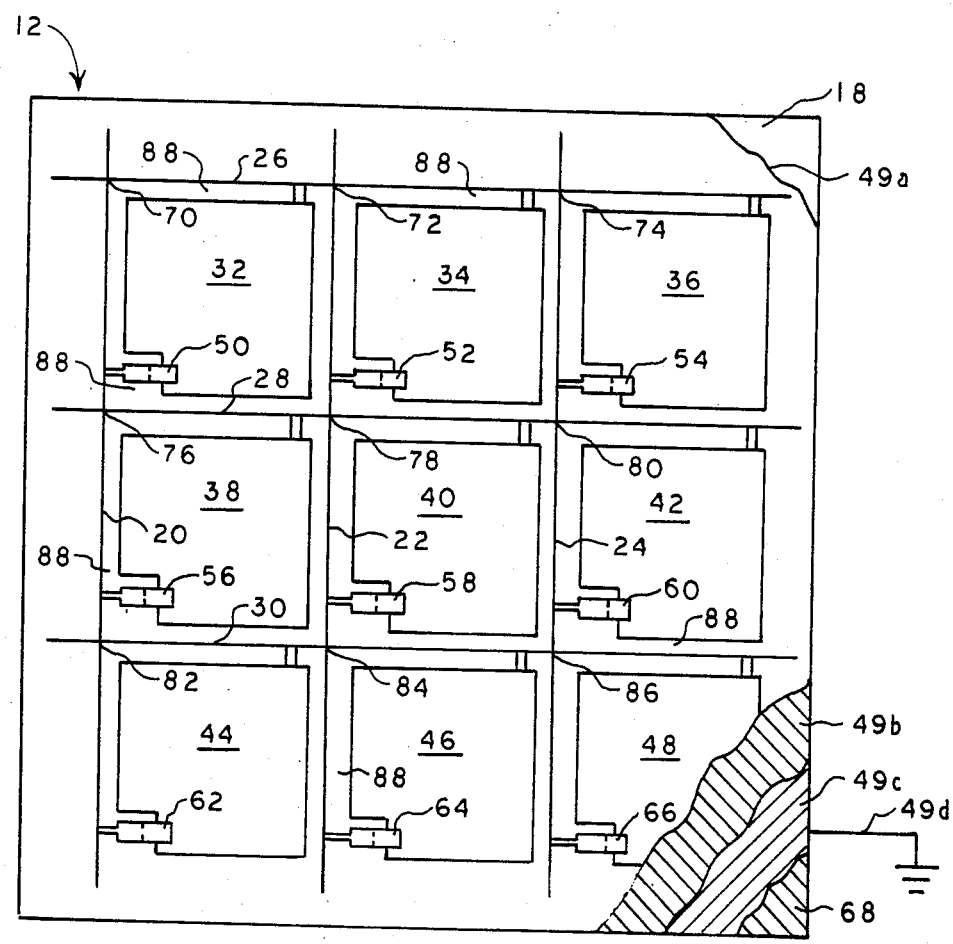
FIG. 2 is a top plan view of the scanner of FIG. 1.

FIGS. 1 and 2 illustrate an X-ray image scanning system and apparatus embodying the present invention.

The system 10 illustrated in FIG. 1 generally includes an apparatus 12 capable of providing electrical signals representative of an image formed by X-rays 13 projected thereon.

The apparatus 12 includes a substrate 18, a first set of X address lines including address lines 20, 22, and 24, a second set of Y address lines including address lines 26, 28, and 30, and a plurality of light sensitive elements, for example, elements 32–48 as seen in FIG. 2. Each light sensitive element 32–48 includes an overlying transparent conductor formed of indium tin oxide 32a–48a, respectively. The apparatus 12 further includes a multilayer energy converter 49 having a continuous transparent, insulating layer 49a formed of silicon dioxide, that overlies the conductive layers 32a–48a of the elements 32–48 and which fills the spaces therebetween, a continuous, opaque layer 49b of a phosphorescent material such as zinc sulfide overlying the transparent light insulating layer 49a and a continuous conductive layer 49c transparent to X-rays that overlies the phosphorescent layer 49b. The conductive layer 49c could be, for example, a thin layer of aluminum. The layer 49c is grounded by a ground 49d to drain off any accumulated charge. The layer 49b is arranged to phosphoresce when impinged upon by the X-rays 13 to convert the X-ray energy with an intensity in a first energy range to light energy with an intensity in a second energy range. The transparent layer 49a is shown in FIG. 2 covering the apparatus 12. Layers 49c and 49d are shown broken away in FIG. 2. The apparatus 12 also includes isolation devices 50, 52, 54, 56, 58, 60, 62, 64, and 66 associated with each light sensitive element. A cover 68 which is transparent to X-rays and preferably opaque to visible light covers and protects the system 10.

As can be noted in FIG. 2, the X address lines 20, 22, and 24 and the Y address lines 26, 28, and 30 cross at an angle, and, as will be more apparent hereinafter, are spaced from one another to form a plurality of crossover points 70, 72, 74, 76, 78, 80, 82, 84, and 86. Associated with each of the crossover points is a respective one of the light sensitive elements 32–48. The light sensitive elements 32–48 are formed as a two-dimensional array of sensors on the substrate 18 and are distributed thereover in spaced apart relation with regions 88 therebetween.

Since the incident radiation 13 impinges on the converter 49 through the cover 68, it is not necessary to provide regions between the elements 32–48 for the incident radiation 13 to pass through as in the case where a backlight form of lighting is used. The light sensitive elements 32–48 are thus preferably made large so as to maximize absorption of light from the converter 49 and area of each of the regions 88 is minimized.

The light sensitive elements are further of the type which effect a detectable electrical characteristic in response to the receipt of light thereon from the phosphorescent material. As will be more fully described hereinafter, the light sensitive elements can comprise photovoltaic cells or photoresistors which effect a detectable change in electrical conductivity in response to the receipt of incident light thereon. The light sensitive elements are preferably formed from a deposited semiconductor material, such as, an amorphous semiconductor alloy. Preferably, the amorphous semiconductor alloy includes silicon and hydrogen and/or fluorine. Such alloys can be deposited by plasmaassisted chemical vapor deposition, i.e., glow discharge, as disclosed, for example, in U.S. Pat. No. 4,226,898 which issued on Oct. 7, 1980 in the names of Stanford R. Ovshinsky and Arun Madan for Amorphous Semiconductors Equivalent To Crystalline Semiconductors Produced By A Glow Discharge Process.

Each of the isolating devices 50-66 is associated with a respective one of the light sensitive elements. The isolation devices are also preferably formed from a deposited semiconductor material, and most preferably, an amorphous semiconductor alloy including silicon. The amorphous silicon alloy can also include hydrogen and/or fluorine and can be deposited by plasma-assisted chemical vapor deposition as disclosed in the aforementioned U.S. Pat. No. 4,226,898. As can be noted in FIG. 2, each of the isolation devices 50-66 is coupled in series relation with its associated light sensitive element between respective pairs of the X address lines 20, 22, and 24 and the Y address lines 26, 28, and 30. As a result, the isolation devices facilitate the selective addressing and detection of the electrical conductivity of each of the light sensitive elements by the application of read potentials to respective pairs of the X and Y address lines.

The cover 68 may be adhered to the converter 49 by an adhesive or may be a polymer or other coating directly applied. When the cover 68 is adhered to the converter 49, the adhesive is preferably a material which is transparent to X-rays 13.

When the X-ray image is to be scanned, the X-ray image represented by the arrows 13 is projected onto the apparatus 12. The X-rays 13 will penetrate the cover 68 and conductive layer 49c and strike the layer of phosphorescent material 49b in their path. The phosphorescent layer 49b will phosphoresce and convert the X-ray energy to light energy. Light from the phosphorescent layer 49b will pass through the transparent insulating layer 49a and then strike the associated light sensitive element such as element 44 or 46. Since the light sensitive elements 32-48 are adapted to effect a detectable change in an electrical characteristic thereof responsive to the receipt of incident light, the light sensitive elements which receive light from the adjacent region of the phosphorescent layer 49b will therby effect a detectable change in that electrical characteristic. When the light sensitive elements 32-48 are formed from photovoltaic cells, they will effect a change in electrical conductivity and will also generate current. When the light sensitive elements are photoresistors, they will effect an increased electrical conductivity. Either electrical characteristic change can be detected by the application of read potentials to the respective pairs of the X address lines 20, 22, and 24, and the Y address lines 26, 28, and 30.

Electrical signals representing a faithful reproduction of the X-ray image can be obtained because the light sensitive elements 32-48 can be made very small. For example, the light sensitive elements 32-48 can be made to have dimensions of approximately 90 microns on a side. The isolating devices 50-66 can be formed to have a dimension of about 10-40 microns on a side and preferably 20 microns on a side. The light sensitive elements can be arranged in substantially coplanar relation so that each will be equally spaced from the phosphorescent layer 49b. Further, the magnitude of the conductivity of the photogenerated current is related to the intensity of the X-rays and can be sensed to obtain gray scale information. Although FIG. 2 illustrates a 3×3 matrix of light sensitive elements, it can be appreciated that a much larger array of elements would be utilized in actual practice.

The electrical characteristic, and, in accordance with this preferred embodiment, the electrical conductivity of the light sensitive elements can be detected by applying read potentials to respective pairs of the X and Y address lines in series, and one at a time. However, and most preferably, the light sensitive elements can be divided into groups of elements and the read potentials can be applied to each group of elements in parallel to facilitate more rapid scanning of the document. Within each group of elements, the elements can be scanned in series.

In the embodiment of FIGS. 1, 2 the multilayer energy converter 49 converts electromagnetic energy in the form of X-rays, a first form of energy, with photons or particle energies in a first energy range, into visible light, a second form of energy with photon energies in a second energy range. While in an exemplary embodiment X-rays have been disclosed, it will be understood that the use of any type of energy including any form of electromagnetic energy that can excite the phosphorescent layer 49b is within the scope of the present invention.

Figure 3:
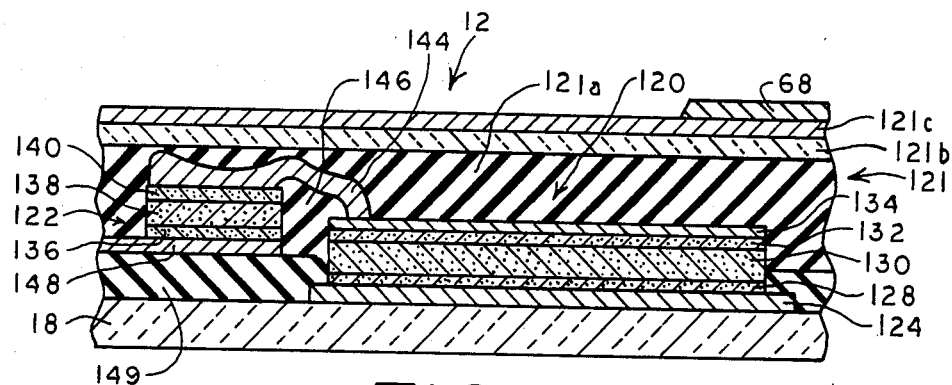
FIG. 3 is a partial cross-sectional side view illustrating a light sensitive element, a layer of conversion material, and an isolating device associated therewith embodying the present invention.
Figure 4:
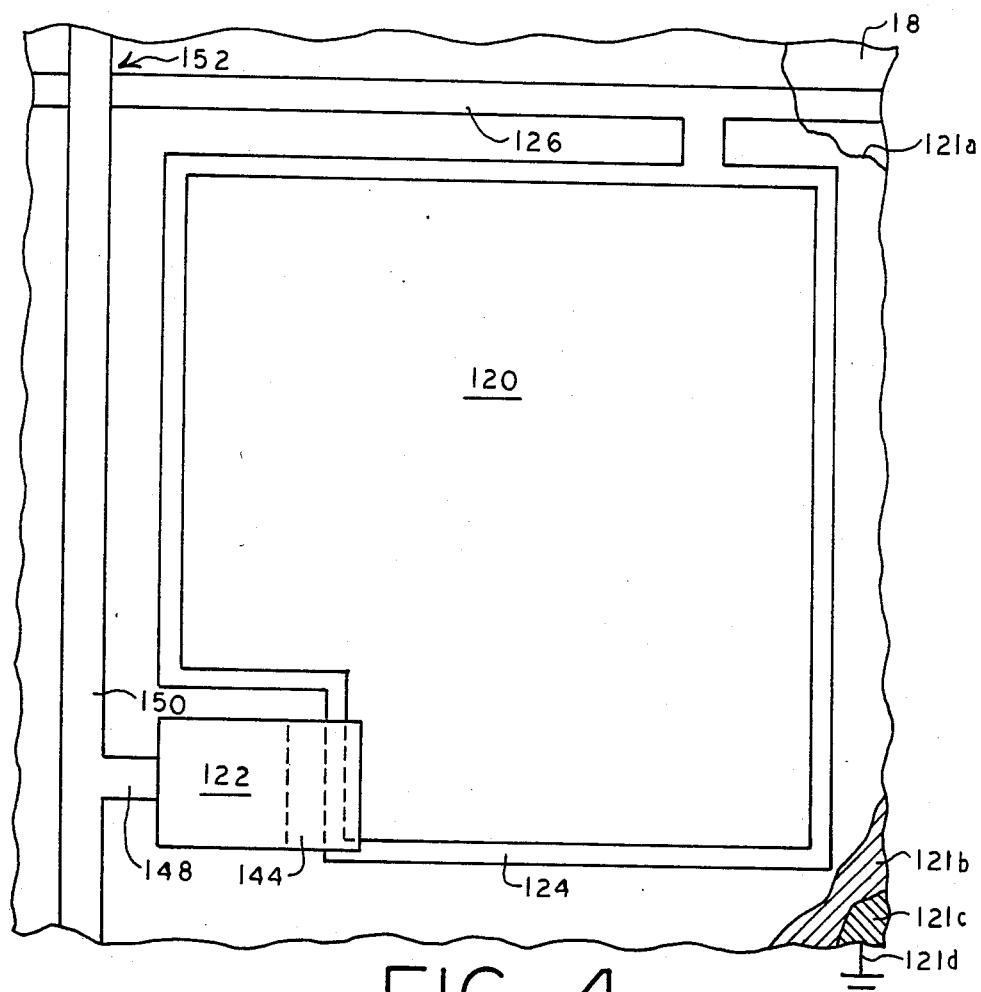
FIG. 4 is a top plan view of the structure of FIG. 3.

FIGS. 3 and 4 illustrate in greater detail a configuration of an amorphous light sensitive element 120, its associated converter of energy 121 and isolation device 122 in accordance with the present invention. Here, the apparatus 12 includes the substrate 18 upon which is formed a metal pad 124 which is electrically connected to a Y address line 126. The metal pad 124 can be formed from aluminum, chromium, or molybdenum, for example.

Formed on the metal pad 124 is the light sensitive element 120 which can take the form of a photovoltaic cell. The photovoltaic cell or light sensitive element 120 can include an amorphous silicon alloy body having a first doped region 128, an intrinsic region 130, and a second doped region 132. The regions 128 and 132 are preferably opposite in conductivity wherein the region 128 is p-type and the region 132 is n-type. Overlying the n-type region 132 is a layer of a transparent conductor 134 formed of indium tin oxide, for example. Photovoltaic cells of this type are fully disclosed, for example, in the aforementioned U.S. Pat. No. 4,226,898 and therefore need not be described in detail herein.

The metal pad 124 not only forms an ohmic contact with the light sensitive element 120 but in addition, serves to block light from reaching the back side of the light sensitive element. This function of the metal pad 124 is particularly important when the substrate 18 is transparent to light.

The converter of energy 121 includes a continuous, transparent, insulating layer 121a formed out of silicon dioxide. The layer 121a can have a thickness on the order of 500A to 1 micron. The converter 121 also includes phosphorescent layer 121b formable of zinc sulfide with a thickness between 1 micron and 100 microns with 20 microns preferred. The converter 121 also includes a layer 121c of deposited metal such as aluminum that is grounded at 121d. The thickness of the metal layer 121c is between 100A and 1000A with 300A being the preferred thickness. The energy converter 121 converts X-rays, a form of electromagnetic radiation with an intensity in a first energy range into visible light, also a form of electromagnetic energy, with an intensity in a second energy range.

The isolation device 122, in accordance with this embodiment, comprises a diode, also formed from an amorphous silicon alloy having a p-type region 136, an intrinsic region 138, and an n-type region 140. The diode 122 is also formed on a metal pad 148 which is formed on a layer of a deposited insulator 149 which can be formed from, for example, silicon oxide or silicon nitride. The diode 122 can be formed during the same deposition as the photovoltaic device 120.

The diode 122 is coupled to the photovoltaic cell 120 by an interconnect lead 144. Separating the diode 122 from the photovoltaic cell 120 is a deposited insulator 146 which can also be formed from silicon oxide or silicon nitride.

The metal pad 148 is coupled to an X address line 150. As can be noted in FIG. 3, the X address line 150 and the Y address line 126 are spaced apart by the insulating layer 149. Because the address lines cross at an angle and are separated from one another, an insulated crossover point 152 is thereby formed.

The structure of FIG. 3 is completed by the cover member 68 which is transparent to X-rays. It is disposed over the energy converter 121 and is adhered thereto by an adhesive which is transparent to X-rays and preferably opaque to visible light.

Figure 5:
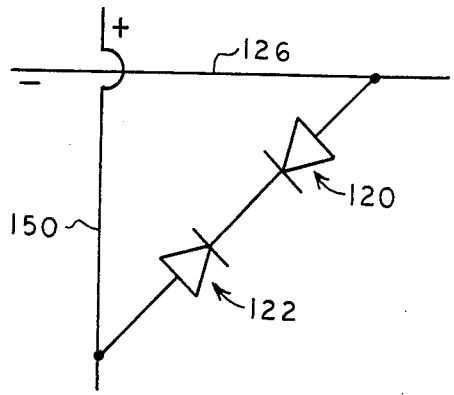
FIG. 5 is an equivalent circuit diagram of the structure of FIG. 3.

Referring now to FIG. 5, it illustrates the equivalent circuit diagram of the light sensitive element 120, the isolating diode 122, and the address lines 126 and 150. It can be noted that the interconnect lead 144 connects the cathodes of the photovoltaic cell 120 and diode 122 together. The anode of the diode 122 is coupled to the X address line 150 and the anode of the photovoltaic cell 120 is coupled to the Y address line 126.

In order to read the electrical characteristic of the photovoltaic cell 120, a positive potential is applied to the X address line 150 and a negative potential is applied to the Y address line 126. This forward biases the isolating diode 122. If light is being received by the photovoltaic cell 120, a photogenerated current will be produced within the cell 120 and will be detected through the forward biased diode 122. However, if the cell 120 is not receiving light, substantially no photogenerated current will be produced by the cell 120. The difference between the two current levels can therefore be contrasted for deriving an electrical signal representative of the X-ray image adjacent the cell 120.

Figure 6:
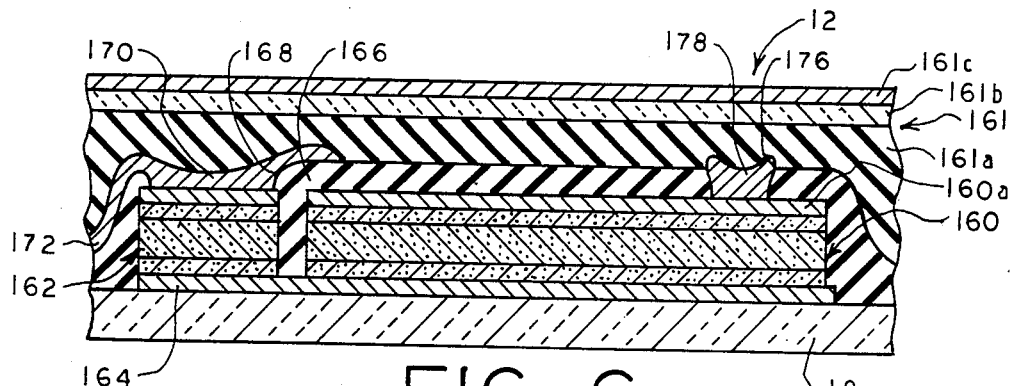
FIG. 6 is a partial cross-sectional side view of another light sensitive element, layer of conversion material, and isolating device structured in accordance with a further embodiment of the present invention.

Referring now to FIG. 6, it illustrates another light sensitive element 160, energy conversion element 161, and isolation device 162 in a configuration embodying the present invention. Here again, the apparatus 12 includes a substrate 18, the photovoltaic cell 160 with an overlying conductive layer 160a, the converter of energy 161 overlying the cell 160, and the isolating diode 162. The light sensitive element or cell 160 and the diode 162 can be identical to the isolating diode 122 and the cell 120 disclosed with respect to FIG. 3.

The diode 162 and light sensitive element or cell 160 are formed on a conductive metal pad 164. The diode 162 and cell 160 are separated by a deposited insulator 166 which again can be formed from silicon oxide or silicon nitride. Formed in the insulator 166 is an opening 168 which permits a metal lead 170 to be formed in contact with the diode 162 and with an X address line 172. Formed in the insulating layer 166 is an opening 176 which permits the formation of another metal lead 178 to form a Y address line. As in the case of the embodiments of FIGS. 1, 3 the energy converter is a multi-layered element having an insulating layer 161a, a phosphorescent layer 161b and a grounded metal layer 161c.

Figure 7:
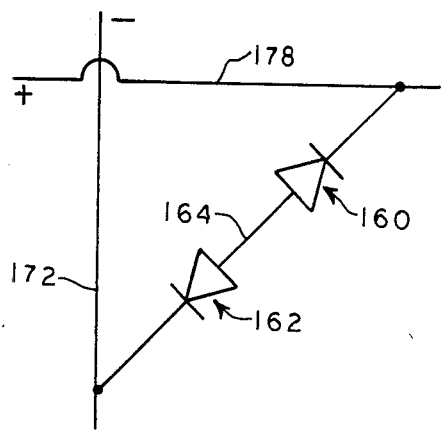
FIG. 7 is the equivalent circuit diagram of the structure of FIG. 6.

FIG. 7 illustrates the equivalent circuit of the structure of FIG. 6. Because the diode 162 and light sensitive element or cell 160 are formed on a common metal pad 164, the anodes of the diode 162 and cell 160 are coupled together. The cathode of the cell 160 is coupled to the Y address line 178 and the cathode of the diode 162 is coupled to the X address line 172. To read the condition of the cell 160, a negative potential is applied to the X address line 172 and a positive potential is applied to the Y address line 178 to forward bias diode 162. With diode 162 forward biased, the electrical conductivity or photogenerated current of cell 160 can be detected for deriving an electrical signal representative of the X-ray image portion adjacent the cell 160.

Figure 8:
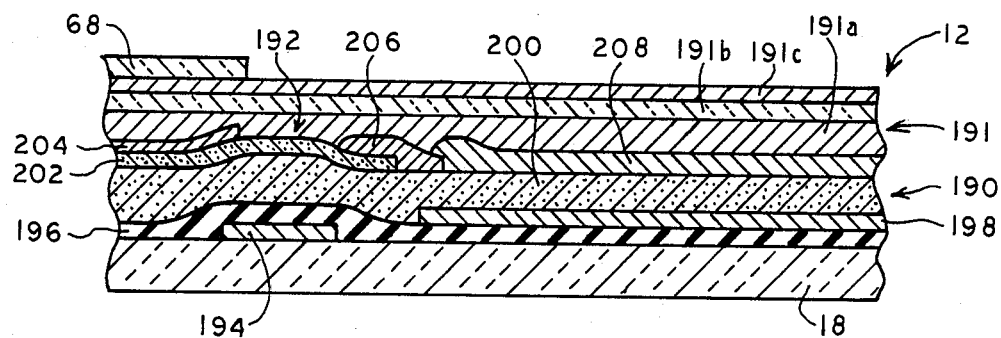
FIG. 8 is a partial cross-sectional side view of another light sensitive element, layer of conversion material, and isolating device embodying the present invention.

Referring now to FIG. 8, it illustrates a further configuration of light sensitive element 190, multilevel energy converter 191, and isolation device 192. Here, the light sensitive element takes the form of a photoresistor and the isolating device 192 takes the form of a thin film field effect transistor.

The apparatus 12 illustrated in FIG. 8 includes a substrate 18 upon which is formed the gate 194 of the thin film field effect transistor 192. A layer of insulating material 196 is then deposited over the gate 194 and the substrate 18. A metallic pad 198 is then formed over the insulator 196 to form one contact of the light sensitive element or photoresistor 190.

A substantially intrinsic amorphous silicon alloy layer 200 is then deposited as shown for forming the semiconductor of the thin film field effect transistor 192 and the semiconductor of the photoresistor 190. A layer 202 of n-type amorphous silicon can then be formed over the intrinsic amorphous silicon alloy 200 to enhance the ohmic contact between the source and drain electrodes 204 and 206 with the amorphous silicon alloy 200. A layer of a transparent conductor 208 such as indium tin oxide can be formed over the amorphous silicon alloy 200 in contact with the transistor electrode 206 and in a corresponding configuration to the metal pad 198 to form the top contact of the photoresistor 190. The structure of FIG. 8 is completed with the multilevel energy converter 191, with a silicon dioxide insulating layer 191a, a phosphorescent layer 191b overlying the insulator 191a and a grounded conductive layer 191c overlying the phosphorescent layer 191b. A cover 68 can be affixed to the conductive layer 191c.

Figure 9:
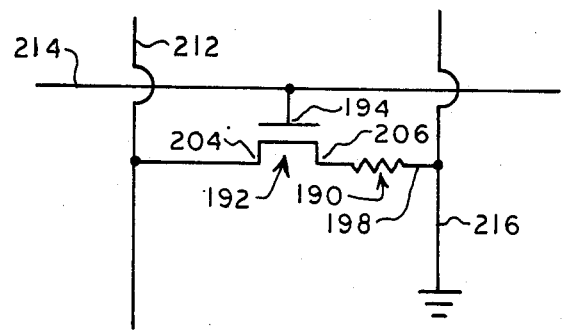
FIG. 9 is the equivalent circuit diagram of the structure of FIG. 8.

As will be noted in FIG. 8, the gate 194, the electrode 204, and the bottom contact 198 of the photoresistor 190 are all vertically separated from one another. As a result, each of these elements can be connected to respective address lines while being insulated from one another. FIG. 9 shows the equivalent circuit diagram of the structure of FIG. 8.

In FIG. 9, it can be noted that the electrode 204 of the thin film field effect transistor 192 is coupled to an X address line 212. The gate 194 of the transistor 192 is coupled to a Y address line 240. The bottom contact 198 of the photoresistor 190 is coupled to a common potential such as ground by a lead 216. As a result, the electrical conductivity of the photoresistor 190 can be sensed by the application of suitable potentials to the electrode 204 and gate 194 for turning the transistor 192 on. If light is being received by the photoresistor 190 from the phosphorescent layer 191, a current will flow between the transistor electrodes 204 and 206 which can be sensed on the X address lead 212. However, if the photoresistor 190 is not receiving light, substantially no current will flow from the electrode 204 to the electrode 206. In this manner, the condition of the photoresistor 190 can be detected.

An alternate embodiment of the invention uses an accelerated beam of electrons in place of the X-rays disclosed above. In this alternate embodiment, the electron beam can be deflected as in a raster scanning system. As the deflected beam of electrons impinges upon the sensor elements, such as the sensor element of FIG. 8, the energy of the electrons excites the phosphorescent layer 191b causing it to emit visible light as do the X-rays. The visible light is detected by the element 190. Hence, as in the embodiments of FIGS. 1-9, there is a conversion from a first form of energy with an intensity in a first range, that of the moving electrons, to a second form of energy with an intensity in a second energy range, emitted light.

From the foregoing, it can be appreciated that the present invention provides a new and improved apparatus for providing electrical signals representative of an X-ray image projected thereon. As can be appreciated from the foregoing, the light sensitive elements can be formed from photovoltaic cells or photoresistors which exhibit a detectable change in an electrical characteristic such as electrical conductivity upon receipt of incident light thereon from an associated adjacent phosphorescent layer. The isolating devices can take the form of diodes or thin film field effect transistors, for example, and any combination of such light sensitive elements and isolating devices are possible. Any spatially distributed form of electromagnetic or accelerated beam energy with an energy intensity in a first energy range can be used to represent the image. Any solid state converter of energy from a first energy form to a second electromagnetic energy form may be used without departing from the spirit or scope of the present invention.

What is claimed is:

1. An apparatus for providing electrical signals representative of an image formed by projecting thereon a spatially varying intensity distribution of a first form of electromagnetic energy having incident energy in a first range, said apparatus comprising:
   means, responsive to said spatially varying distributions, for converting said first form of electromagnetic energy incident upon a first surface thereof to a second form of electromagnetic energy in a second energy range different from said first energy range; said converting means including: a layer of phosphorescent material, a metal layer disposed proximate said energy incident surface and a layer of transparent insulating material disposed distal said energy incident surface, said photophosphorescent layer disposed between said metal layer and said insulating layer;
   an array of energy sensitive elements, said elements being responsive to the impingement of said second form of energy for causing a change in a detectable electrical characteristic; and
   means for enabling the selective detection of said electrical characteristic of said energy sensitive element.

2. An apparatus as defined in claim 1 wherein:
said converting means overlie said energy sensitive elements.

3. An apparatus as defined in claim 1 wherein:
each said energy sensitive element includes deposited semiconductor material.

4. An integrated convertor-sensor apparatus for providing a signal corresponding to a spatially varying pattern of energy projected thereupon said apparatus including:
   a substrate having disposed thereupon an array of thin film photoresponsive elements, said elements being adapted to absorb photons of a preselected energy range and generate a detectable electrical signal corresponding thereto;
   means for converting said spatially varying pattern of energy into photons of said preselected energy range, said conversion means including a layer of phosphorescent material and a layer of electrically conductive material which is substantially transparent to said pattern of energy, said conductive layer being generally coextensive with the energy incident side of said conversion means, said conversion means generally co-extensive with, electrically isolated from, optically coupled to and in intimate contact with said thin film array, so that said spatially varying pattern projected upon said conversion means is converted to a corresponding spatially varying pattern of photons, which pattern is incident upon said thin film array, whereby an electrical signal corresponding to said projected pattern is generated thereby.

5. An apparatus as in claim 4, wherein each of said thin film photoresponsive elements include therein a layer of semiconductor material chosen from the group consisting essentially of: amorphous silicon alloy materials, amorphous germanium alloy materials, or amorphous silicon germanium alloy materials.

6. An apparatus as in claim 4, wherein said thin film array further includes a matrix of address lines for accessing the elements thereof, and wherein each element includes an isolation device associated therewith.

7. An apparatus as in claim 4, wherein the photoresponsive elements of said thin film array are chosen from the group consisting essentially of: diodes, photoresistors, photovoltaic devices, and combinations thereof.

8. An apparatus as in claim 6, wherein said isolation device is chosen from the group consisting essentially of: diodes, thin film transistors and, combinations thereof.

9. An apparatus as in claim 6, wherein said photoresponsive elements and said isolation devices are p-i-n type diodes.

10. An apparatus as in claim 4, wherein said conversion means further includes a layer of electrically insulating material which is substantially transparent to said photons of a preselected energy range, said layer interposed between the sensor array and the layer of phosphorescent material and adapted to optically couple said conversion means to asid thin film array.

11. An apparatus as in claim 4, wherein said conversion means further includes a layer of material disposed upon the energy incident side thereof, said material substantially opaque to said photons of a preselected energy range and substantially transparent to said spatially varying pattern of energy.

12. An apparatus as in claim 4, wherein said spatially varying pattern of energy is a pattern of X-radiation and said conversion means is adapted to convert X-rays incident thereupon to photons of visible light.

13. An apparatus as in claim 4, wherein said spatially varying pattern of energy is a pattern of accelerated particles and said conversion means is adapted to convert said accelerated particles to visible photons.

* * * * *